(12) United States Patent
Liao

(10) Patent No.: US 10,026,638 B2
(45) Date of Patent: Jul. 17, 2018

(54) PLASMA DISTRIBUTION CONTROL

(71) Applicant: Taiwan Semiconductor Manufacturing Co., Ltd., Hsin-Chu (TW)

(72) Inventor: Han-Wen Liao, Taichung (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 15/380,941

(22) Filed: Dec. 15, 2016

(65) Prior Publication Data

US 2018/0174883 A1 Jun. 21, 2018

(51) Int. Cl.
| | |
|---|---|
| H01L 21/687 | (2006.01) |
| H01L 21/67 | (2006.01) |
| H01J 37/32 | (2006.01) |
| C23C 16/50 | (2006.01) |
| H01L 21/02 | (2006.01) |
| H01L 21/285 | (2006.01) |
| H01L 21/3065 | (2006.01) |
| H01L 21/311 | (2006.01) |
| H01L 21/3213 | (2006.01) |

(52) U.S. Cl.
CPC ........ *H01L 21/68714* (2013.01); *C23C 16/50* (2013.01); *H01J 37/32009* (2013.01); *H01J 37/32532* (2013.01); *H01L 21/67069* (2013.01); *H01J 2237/334* (2013.01); *H01L 21/0262* (2013.01); *H01L 21/02274* (2013.01); *H01L 21/28556* (2013.01); *H01L 21/3065* (2013.01); *H01L 21/31116* (2013.01); *H01L 21/31138* (2013.01); *H01L 21/32136* (2013.01)

(58) Field of Classification Search
CPC ......... H01L 21/68714; H01L 21/67069; H01L 21/02274; H01L 21/0262; H01L 21/28556; H01L 21/3065; H01L 21/3111; H01L 21/31138; H01L 21/32136; C23C 16/50; H01J 37/32009; H01J 37/32532; H01J 2237/334
See application file for complete search history.

(56) References Cited

U.S. PATENT DOCUMENTS

| | | | | | |
|---|---|---|---|---|---|
| 6,830,653 | B2 * | 12/2004 | Okumura | ............ | C23C 16/4412 118/723 AN |
| 7,906,032 | B2 * | 3/2011 | Yamashita | ................ | B08B 7/00 118/715 |
| 2002/0164883 | A1 * | 11/2002 | Ohmi | ...................... | C03C 15/00 438/719 |
| 2005/0017201 | A1 * | 1/2005 | Kwon | ............... | H01J 37/32082 250/492.2 |
| 2005/0221020 | A1 * | 10/2005 | Fukiage | .............. | C23C 16/4404 427/569 |

* cited by examiner

*Primary Examiner* — Karen Kusumakar
(74) *Attorney, Agent, or Firm* — Haynes and Boone, LLP

(57) ABSTRACT

A system is configured to perform plasma related fabrication processes. The system includes a process chamber and a wafer stage positioned within the process chamber. The wafer stage is configured to secure a process wafer. The system further includes a bottom electrode positioned beneath the wafer stage, a top electrode positioned external to the chamber, and a plasma distribution mechanism. The plasma distribution mechanism is reconfigurable to allow for more than one plasma distribution profile.

20 Claims, 10 Drawing Sheets

PLASMA DISTRIBUTION CONTROL

BACKGROUND

In the semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing.

Semiconductor device fabrication includes many different processes. Many processes are plasma related processes. Such plasma-related processes include plasma etching, plasma ashing, Chemical Vapor Deposition (CVD), and Physical Vapor Deposition (PVD). Such processes typically involve use of a plasma gas that is used to either carry a material to be deposited onto a substrate or to react with a material to be removed from the substrate. The plasma gas is directed to the substrate using an electromagnetic field.

Some plasma-related fabrication processes may produce undesired results on the wafer. For example, due to various factors, a plasma etching process may etch more material in the center of the wafer than at the edges of the wafer, resulting in a slight dishing effect. Additionally, some plasma deposition processes may result in additional material being deposited toward the center of the wafer, resulting in a bulging effect. It is desirable to produce fabrication processes that address such phenomena.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
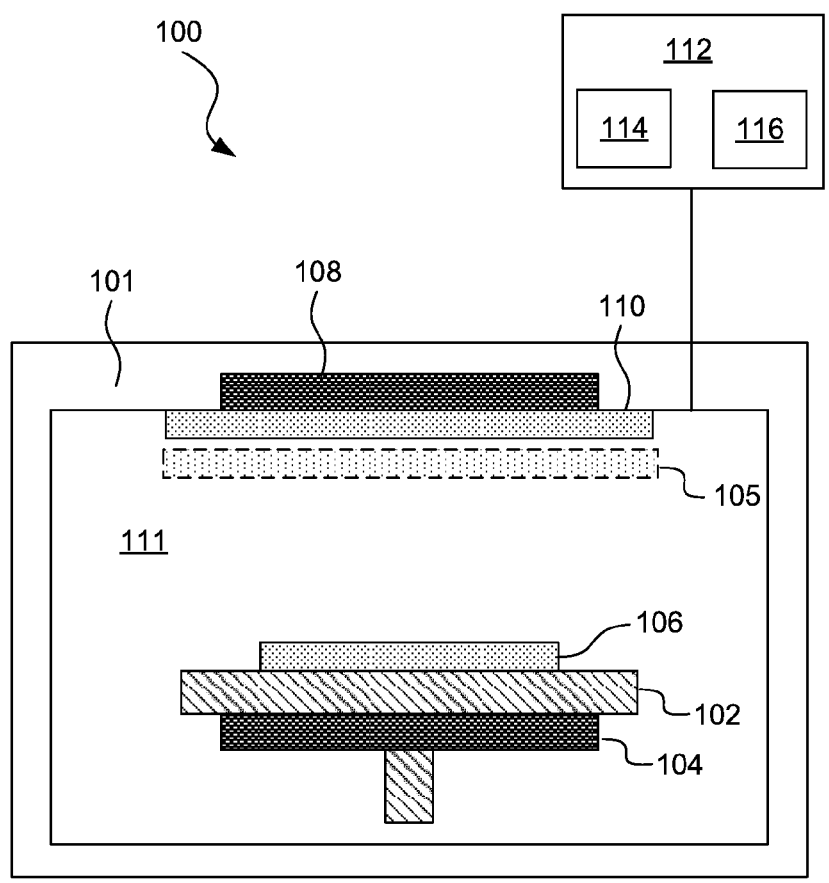
FIG. 1 is a diagram showing an illustrative plasma-related fabrication tool with a reconfigurable plasma distribution mechanism, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As described above, various plasma-related fabrication processes may result in undesired variations on the substrate. To compensate for this, the present disclosure is directed to a plasma distribution mechanism that is reconfigurable to allow for various plasma distribution profiles. By using different plasma distribution profiles for various fabrication processes, variations in the material being affected by such processes can be compensated for. For example, if a plasma etching process undesirably etches more towards the edge of the wafer than at the center, then the plasma distribution profile can be reconfigured to increase the etching effect towards the center of the wafer, thereby compensating for the variations in plasma etching process. This principle may be applied to other plasma-related fabrication processes as well, such as plasma deposition processes.

FIG. 1 is a diagram showing an illustrative plasma-related fabrication tool 100 with a reconfigurable plasma distribution mechanism 110. The plasma-related fabrication tool may be one of a variety of fabrication tools. In one example, the plasma-related fabrication tool is a plasma etching tool. In one example, the plasma-related fabrication tool is a plasma deposition tool.

In the case where the plasma-related fabrication tool 100 is a plasma etching tool, the plasma-related fabrication tool 100 is configured to perform plasma etching processes. In some examples, a plasma etching process may involve the high-speed direction of charged particles at the substrate (e.g., wafer 106). Based on the type of charged particle and the type of material on the substrate, the collision of the charged particles with such material dislodges that material, effectively removing it from the substrate. Other types of plasma etching may be used in accordance with principles described herein.

In the case with the plasma-related fabrication tool 100 is a plasma deposition tool, the plasma-related fabrication tool 100 may be configured to perform plasma deposition processes. One example of such a process is a Plasma Enhanced Chemical Vapor Deposition (PECVD) process. A conventional Chemical Vapor Deposition (CVD) process involves exposing a substrate to a volatile precursor gas, which reacts with the substrate to deposit material onto the substrate. A PECVD process uses plasma to enhance the CVD process by increasing the reaction rate.

Another plasma-related deposition process includes a Physical Vapor Deposition (PVD) process, which may also be referred to as sputtering. A PVD process involves ejecting material from a target onto a substrate. Specifically, charged particles are directed at the target, which causes particles from the target to be ejected. Such ejected particles are then deposited onto the substrate.

According to the present example, the plasma-related fabrication tool 100 includes a casing 101 that forms a chamber 111. Within the chamber 111 is a wafer stage 102 that is configured to secure a wafer 106. Also within the chamber is a bottom electrode 104. At the top of the chamber 111 is a top electrode 108. Somewhere between the wafer stage 102 and the top electrode 108 is the plasma distribution mechanism 110. For some types of plasma-related fabrication tools, such as PVD tools, a target 105 is positioned between the plasma distribution mechanism 110 and the wafer stage 102.

The chamber 111 is a space designed to hold the wafer stage 102 and the bottom electrode 104. The chamber 111 may be in fluid communication with gas sources in order to provide various precursor gases to the chamber 111 for the various fabrication processes that are performed by the plasma-related fabrication tool 100. The chamber 111 may also be in fluid communication with a negative pressure or vacuum in order to purge gas from the chamber.

The wafer stage 102 is designed to hold and secure a wafer 106 during fabrication processes. The wafer 106 may be robotically placed on the wafer stage 102 before the fabrication process and robotically removed after the fabrication process.

The top electrode 108 and the bottom electrode 104 together create an electromagnetic filed within the chamber 111. The power of that electromagnetic field may create plasma within a precursor gas within the chamber 111. Additionally, the electromagnetic field may be biased so as to direct the charged particles within the gas as desired. Specifically, for plasma etching processes or PECVD processes, the plasma may be directed at the wafer 106. For PVD processes, the plasma may be directed at the target 105. In some examples, the plasma chamber walls may be used in place of a top electrode 108. In some examples, the top electrode is integrated with the casing 101 at the top of the chamber 111.

The characteristics of the electromagnetic field, and thus the plasma distribution profile, can be affected by use of a plasma distribution mechanism 110 placed between the top electrode 108 and the wafer stage 102. The plasma distribution mechanism 110 may be a dielectric material having a dielectric constant selected so as to adjust the plasma distribution profile is desired. In one example, the plasma distribution mechanism 110 is also integrated into the casing 101 of the chamber 111 and placed between the top electrode 108 and the exterior of the casing 101. In some examples, the plasma distribution mechanism 110 may be integrated with the casing 101. In some examples, the plasma distribution mechanism 110 may be positioned within the chamber 111 between the casing 101 and the wafer stage 102. In some examples, the plasma distribution mechanism may be part of the top electrode. In some examples, the plasma distribution mechanism may be part of the bottom electrode 104 or may be positioned between the bottom electrode 104 and the wafer 106. Other locations of the plasma distribution mechanism that will allow the plasma distribution mechanism to affect the plasma distribution profile are contemplated.

The control system 112 controls and directs the plasma-related fabrication tool 100. For example, the plasma-related fabrication tool 100 may send signals to robotic mechanisms to manipulate those mechanisms as desired. Particularly, the robotic mechanisms may be manipulated to move a wafer 106 onto or off of the wafer stage 102. The robotic mechanisms may also be manipulated to reconfigure the plasma distribution mechanism 110 to change the plasma distribution profile during operation of the fabrication tool 100.

The control system 112 includes a processor 114 and a memory 116. The memory 116 may include machine readable instructions that when executed by the processor 114, cause the control system 112 to send command signals to the fabrication tool 101. The command signals may instruct the fabrication tool to reconfigure the plasma distribution mechanism to create the desired plasma distribution profile.

Figure 2A:
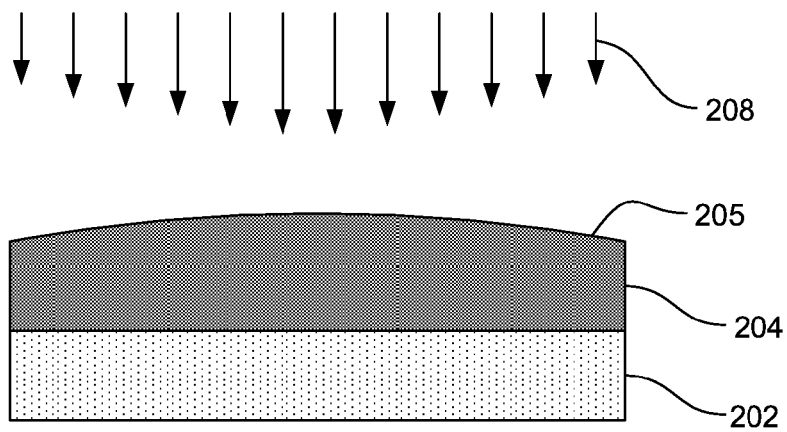
FIGS. 2A, 2B, and 2C are diagrams showing how a reconfigurable plasma distribution mechanism can be used, according to one example of principles described herein.
Figure 2B:
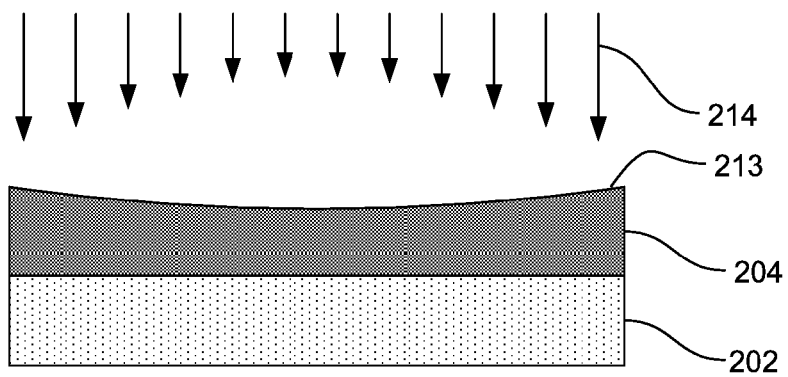
Figure 2C:
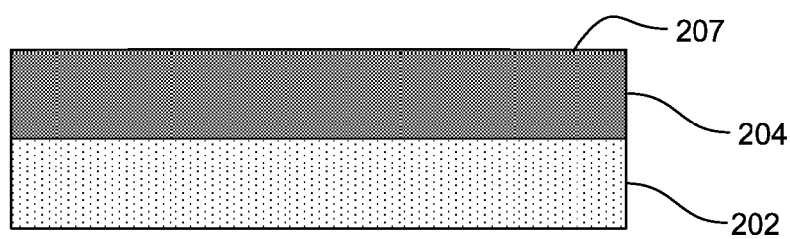

FIGS. 2A-2C are diagrams showing use of a reconfigurable plasma distribution mechanism to achieve a desired result. FIG. 2A illustrates a material layer 204 placed on top of a substrate 202. The substrate 202 may correspond to the wafer (e.g., 106, FIG. 1) described above. The material layer 204 as illustrated as it may appear after an etching process without use of principles described herein. Specifically, the material layer 204 has a curved surface 205 such that the material layer is thicker at the center of the material layer 204 than at the edges. Various factors may cause this effect. For example, the nature of the material of the material layer 204, the environment within the chamber of the tool, the patterns of preceding layers, and other factors may contribute to the curved surface 205. In general, it may be desirable to have a more planar surface 207 as illustrated in FIG. 2C. A more planar surface 207 may increase the quality of subsequent layers formed on the material layer 204.

According to principles described herein, the plasma distribution profile 208 is adjusted through use of a plasma distribution mechanism (e.g., 110, FIG. 1). In the present example, the plasma distribution profile 208 is adjusted such that the etching process is stronger in the center of the wafer and at the edges of the wafer. This may be done, for example, by manipulating electromagnetic field within the chamber to be stronger in the center than the edges. This compensates for the other factors that cause the curved surface 205. Thus, by adjusting the plasma distribution mechanism 110 to create the desired plasma distribution profile 208, a more planar surface 207 can be achieved.

FIG. 2B illustrates another example. In this case, the surface 213 of a material layer 204 has a dishing effect. To compensate for this, the plasma distribution profile 214 can be configured such that the etching process is stronger at the edges than at the center.

For deposition processes, the plasma distribution profile may also be adjusted to compensate for variances in the process. For example, if a deposition process results in a dishing effect without adjusting the plasma distribution profile, then the plasma distribution profile can be adjusted to be stronger in the center so that more material is deposited in the center. This will help achieve a planar surface 207 as desired. Conversely, if the deposition process results in a bulging effect without adjusting the plasma distribution profile, then the plasma distribution profile can be adjusted to be weaker in the center the less material is deposited in the center. Again, this will help achieve a planar surface 207 as desired.

In some examples, deposition processes or etching processes may result in abnormalities at specific zones within the wafer. As will be discussed in more detail below, a plasma distribution mechanism may be used to create a plasma distribution profile that affects specific zones as desired. Thus, fabrication processes applied to the wafer will have a less undesirable effect on such zones.

Figure 3A:
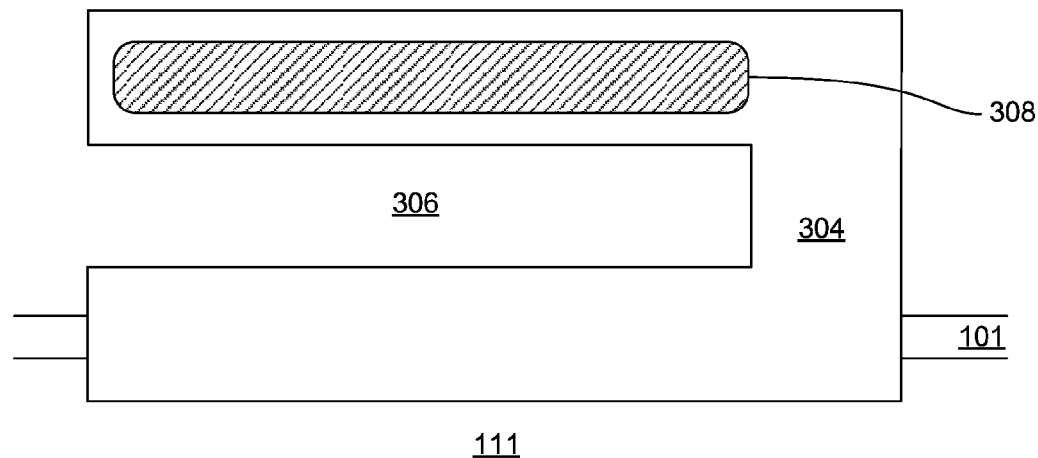
FIGS. 3A and 3B are diagrams showing a plasma distribution mechanism that comprises a variety of plates with varying thicknesses and materials that are insertable into a slot, according to one example of principles described herein.
Figure 3B:
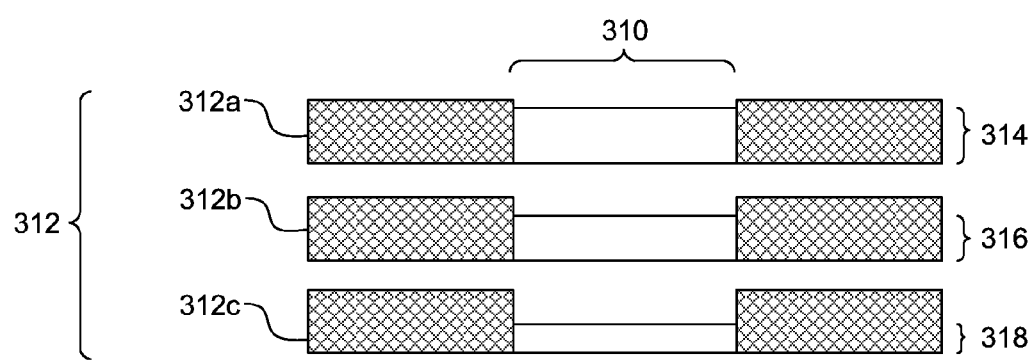

FIGS. 3A-3B are diagrams showing a plasma distribution mechanism that comprises a variety of plates with varying thicknesses and materials that are insertable into a slot 306. According to the present example, as illustrated in FIG. 3A, a structure 304 is positioned at the casing 101 of the plasma-related fabrication tool (e.g., 100, FIG. 1). The structure defines a slot 306 into which at least one interchangeable plate can be inserted. Thus, the interchangeable plates are positioned beneath the top electrode 308. The various interchangeable plates have characteristics that affect the electromagnetic field created in part by the top electrode. Affecting the electromagnetic field in turn affects the plasma distribution profile.

FIG. 3B illustrates a first set 312 of interchangeable, dielectric plates and a second set 314 of interchangeable dielectric plates. The plates in the first set 312 of plates include a center portion 310 with a dielectric material that varies in thickness. Specifically, the center portion 310 of plate 312a has a first thickness 314. The center portion 310 of the second plate 312b has a second thickness 316 that is less than the first thickness 314. The center portion of the third plate 312c has a third thickness 318 that is less than the second thickness 316.

The plates in the second set 320 have a center portion 330 that varies by type of dielectric material. Specifically, the center portion 330 of the first plate 320a has a first type of dielectric material 322. The center portion 330 of the second plate 320b has a second type of dielectric material 324. The center portion 330 of the third plate 320c has a third type of dielectric material 326. The different types of dielectric materials may have different dielectric constants, thus affecting the electromagnetic field and plasma distribution profile in different manners. Examples of dielectric materials may include silicon dioxide (SiO2), silicon nitride (Si3N4), aluminum oxide ($Al_2O_3$), tantalum oxide ($Ta_2O_5$), yttrium oxide ($Y_2O_3$), lanthanum oxide ($La_2O_3$), hafnium oxide ($HfO_2$), zirconium oxide ($ZrO_2$), strontium titanium oxide ($SrTiO_3$), zirconium silicon oxide ($ZrSiO_4$), and hafnium silicon oxide ($HfSiO_4$). Other dielectric materials may be included as well.

The first set 312 and second set 320 are only one example of different types of plates that may be used. In some cases, the sets may be multidimensional. For example, there may be a set of nine plates. In such set, for each different thickness 314, 316, 318, there may be three plates with varying dielectric materials. In some examples, larger sets may also include variations in the size of the center portion.

In some examples, the slot 304 may be configured to hold only a single plate. In some examples, however, the slot 304 may be configured to hold more than one plate. Thus, various combinations of plates can be inserted to achieve the desired plasma distribution profile. For example, plate 312a and plate 320c may both be inserted into the slot at the same time.

In some examples, the plates 312, 320 may be configured to be inserted manually by a technician. In some examples, however, the plates 312, 320 may be insertable through use of a robotic mechanism. For example, the control system (e.g., 112, FIG. 1) may select a particular plasma distribution profiles to be used for an upcoming process. The control system may then determine the appropriate plate or combination of plates to insert into the slot 304 to achieve the particular plasma distribution profile. The control system may then manipulate the robotic mechanisms to collect the appropriate plates 312, 320 and insert them into the slot 304.

Figure 4A:
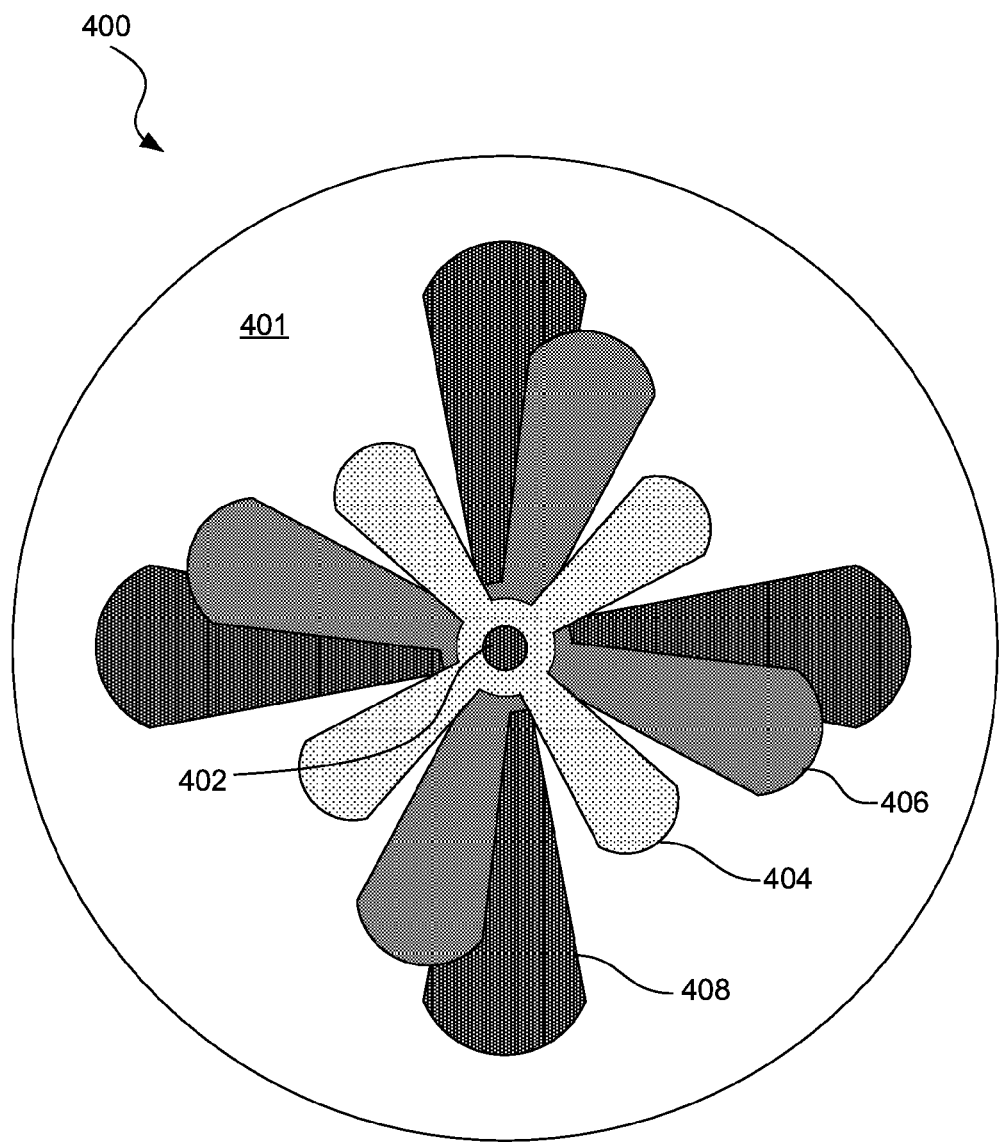
FIGS. 4A and 4B are diagrams showing an illustrative plasma distribution mechanism that includes a plurality of adjustable fans that may vary in size, thickness, and material, according to one example of principles described herein.
Figure 4B:
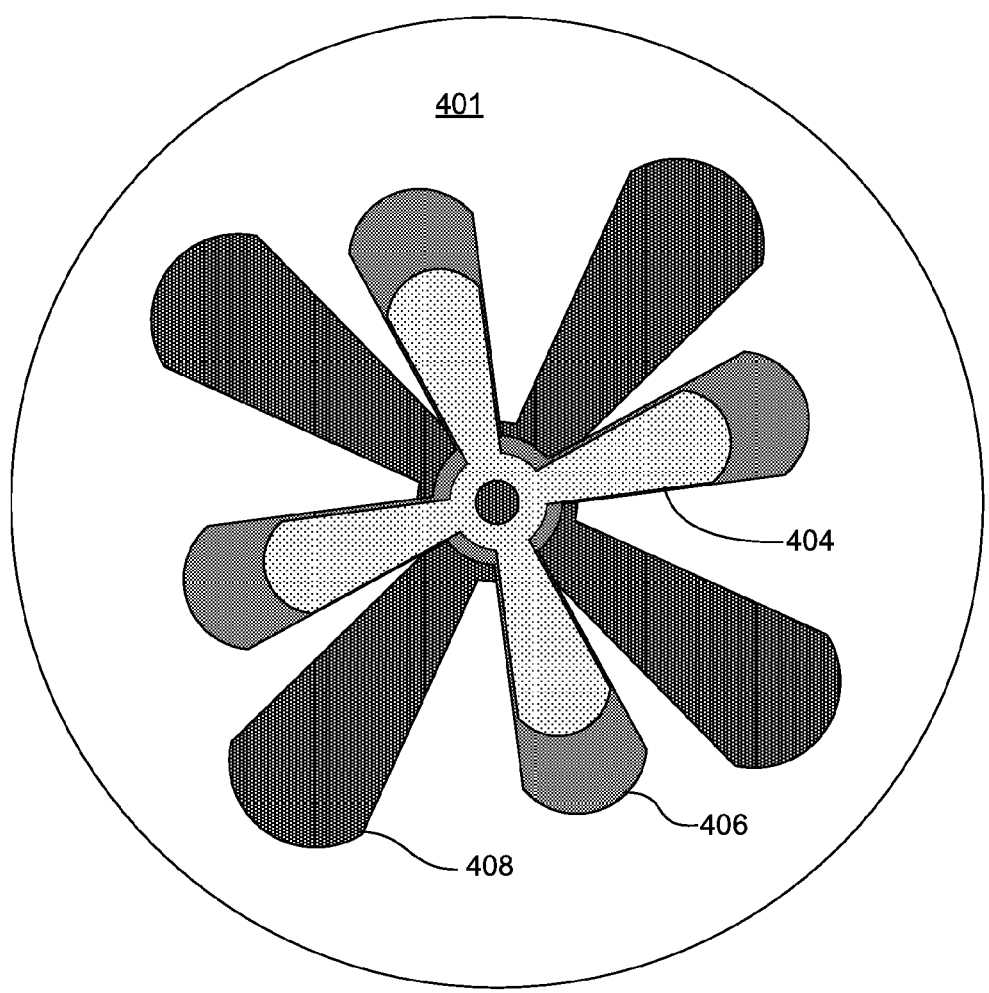

FIGS. 4A-4B are diagrams showing an illustrative plasma distribution mechanism 400 that includes a plurality of adjustable fans 404, 406, 408 that may vary in size, thickness, and material. FIG. 4A illustrates a top view of the plasma distribution mechanism 400 positioned with respect to the top electrode 401. According to the present example, the plasma distribution mechanism 400 includes a first rotatable fan 404, a second rotatable fan 406, and a third rotatable fan 408. Each of the fans 404, 406, 408 rotates around a center axis 402. In the present example, the blade lengths for each fan 404, 406, 408 is different. Specifically, fan 404 has the shortest blade length, fan 406 has a medium-sized blade length, and fan 408 has the longest blade length.

The fans 404, 406, 408 may also vary in other characteristics. For example, the fans 404, 406, 408 may have different thicknesses. Specifically, the blade thickness for each fan may be different. In some examples, the blade width may vary. In some examples, the type of dielectric material for each fan may be different.

Each fan 404, 406, 408 may be independently rotatable to a specific configuration. FIG. 4B illustrates a different fan configuration. By rotating the fans 404, 406, 408 to different configurations, different plasma distribution profiles may be achieved. In some examples, during a particular fabrication process, each of the fans may rotate together so as to maintain their relative set configuration while rotating. In some examples, the rotation speed of the fans may be adjusted to have the desired effect on the plasma distribution profile.

Figure 5A:
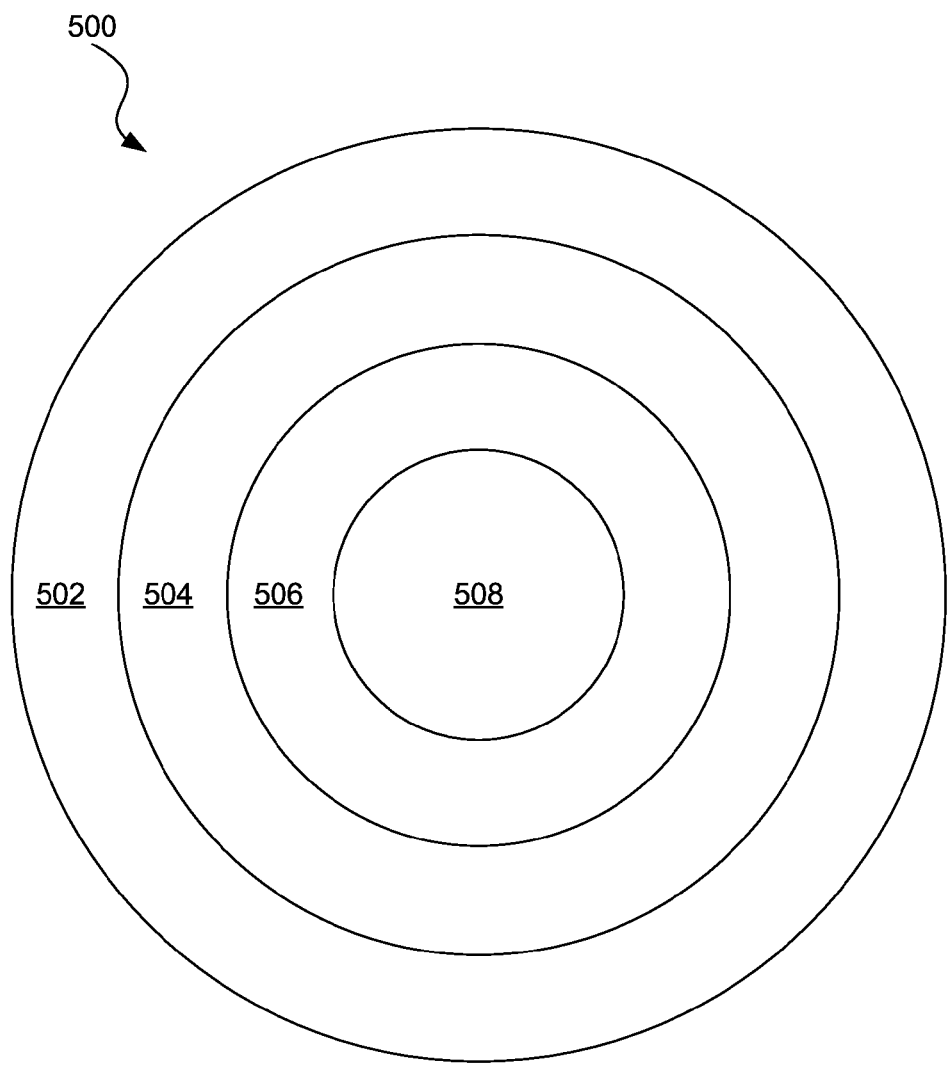
FIGS. 5A and 5B are diagrams showing an illustrative plasma distribution mechanism that includes a plurality of sets of concentric rings that may vary in material and thickness, according to one example of principles described herein.
Figure 5B:
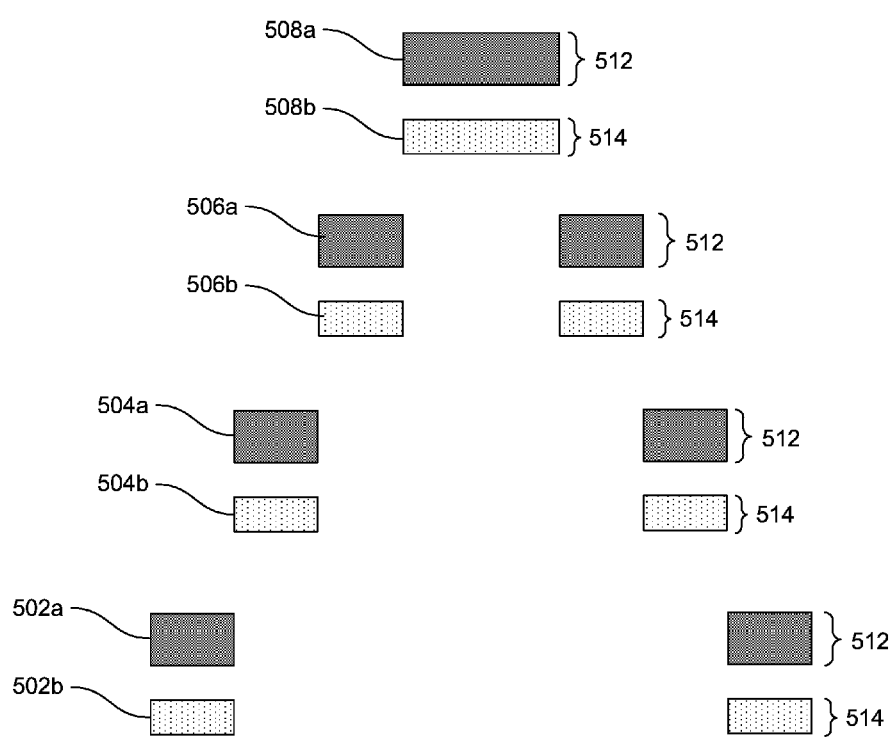

FIGS. 5A-5B are diagrams showing an illustrative plasma distribution mechanism 500 that includes a plurality of sets of concentric rings that may vary in material and thickness. FIG. 5A illustrates a top view of the plasma distribution mechanism 500. In the present example, the plasma distribution mechanism includes four different segments. The first segment 502 is the outermost segment. The second segment 504 is the second outermost segment. The third segment 506 is the second innermost segment. The fourth segment 508 is the innermost segment. Each segment may be filled with one of a plurality of different rings.

FIG. 5B illustrates cross sections of sets of rings for each segment 502, 504, 506, 508. Each set may include multiple rings that vary by thickness, dielectric material, or both. For example, the set of rings for the first segment 502 includes a first ring 502a of a first thickness 512 and first material as well as a second ring 502b of a second thickness 514 and a second material. The set of rings for the second segment 504 includes a first ring 504a of the first thickness 512 and the first material as well as a second ring 504b of the second thickness 514 and the second material. The set of rings for the third segment 506 includes a first ring 506a of the first thickness 512 and the first material as well as a second ring 506b of the second thickness 514 and the second material. The set of rings for the fourth segment 508 includes a first ring 508a of the first thickness 512 and the first material as well as a second ring 508b of the second thickness 514 and the second material.

While only two rings are shown in each set, it is understood that a set of rings for a particular segment 502, 504, 506, 508 may include several rings of varying thickness, material, or both. For example, each set may include 25 rings. Specifically, there may be five different thicknesses and five different types of dielectric materials. Thus, the 25 rings would include every combination of the various thicknesses and various dielectric materials.

A ring from a set associated with one of the four segments may be selected for each segment. Thus, a total of four rings from four different sets will be selected and put together to create the desired compiled plate. The compiled plate may then be placed into position between the top electrode and the wafer stage. This may be done manually by a human operator such as a technician in some examples. In some examples, however, the compiled plate may be assembled and put into place within the plasma-related fabrication tool by robotic mechanisms.

Figure 6A:
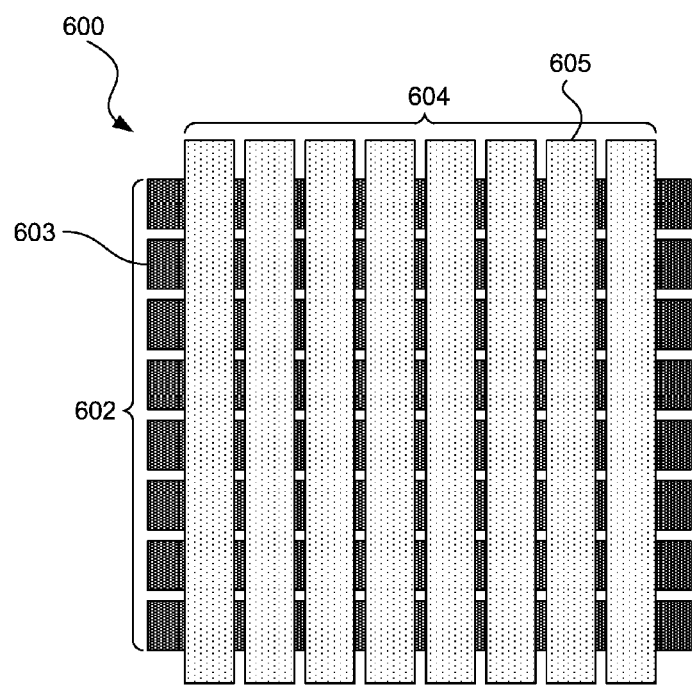
FIGS. 6A, 6B, 6C, and 6D are diagrams showing an illustrative plasma distribution mechanism that includes two sets of elongated shutters that are orthogonal to each other, according to one example of principles described herein.
Figure 6B:
Figure 6C:

FIGS. 6A-6C are diagrams showing an illustrative plasma distribution mechanism 600 that includes two sets of elongated shutters 602, 604 that are orthogonal to each other. FIG. 6A illustrates a top view of the plasma distribution mechanism. As illustrated, a first set of elongated shutters 602 is positioned orthogonal to a second set of elongated shutters 604. In some examples, each individual shutter 603 from the first set of elongated shutters 602 is independently rotatable about an axis. Similarly, each individual shutter 605 from the second set of elongated shutters 604 is independently rotatable about an axis. In some examples, the axis of rotation for a particular shutter may be in the center of the shutter. In some examples, the axis of rotation for a particular shutter may be at an edge of the shutter.

In some examples, the first set of elongated shutters 602 may have a different thickness than the second set of elongated shutters 604. In some examples, the first set of elongated shutters 602 may be made of a different dielectric material than the second set of elongated shutters 604. In some examples, the first set of elongated shutters 602 may differ in both thickness and material from the second set of elongated shutters 604.

FIG. 6B illustrates a cross-sectional view of the shutters 603 from the first set of elongated shutters 602 along the longitudinal axis of the shutters 603. Similarly, FIG. 6C illustrates a cross-sectional view of the shutters from and the shutters 605 from the second set of elongated shutters 604. Thus, the view of FIG. 6C is orthogonal to the view of FIG. 6B. As mentioned above, each shutter may be independently rotatable to a different position. Thus, the shutters 603, 605 from both sets 602, 604 may be set to particularly positions so as to vary the plasma distribution profile. For example, the angle of a shutter with respect to the biased electromagnetic field between the top electrode and the bottom electrode will determine its effect on the electromagnetic field.

Figure 6D:
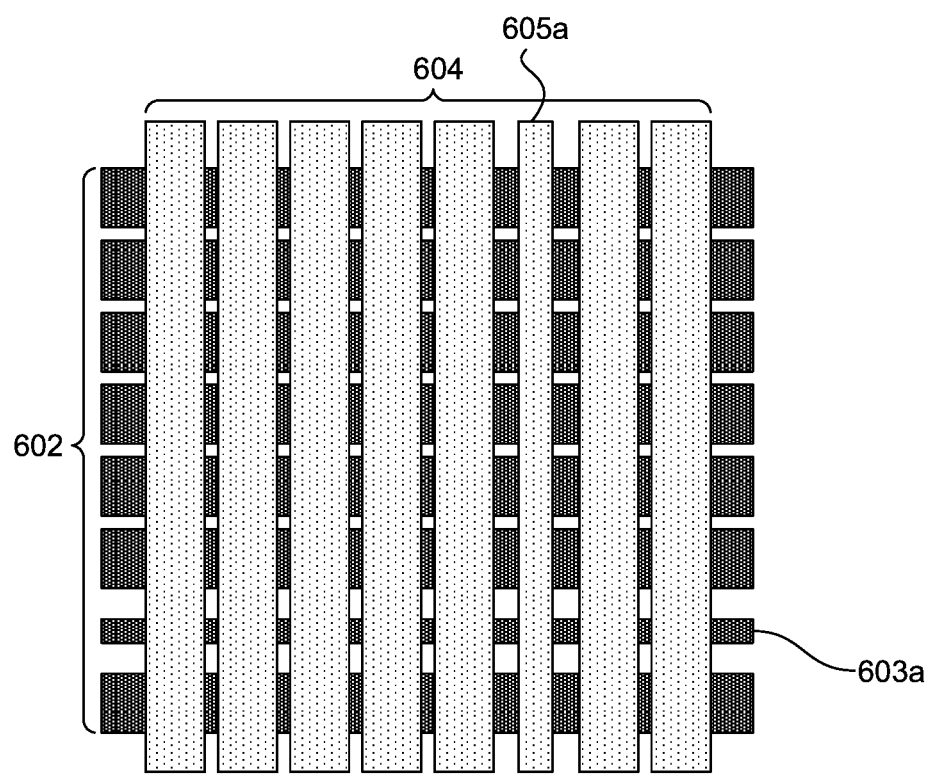

FIG. 6D illustrates an example in which only one 603a from the first set of elongated shutters 602 and one shutter 605a from the second set of shutters 604 is rotated differently than the rest of the shutters in their respective sets. This affects the plasma distribution profile in a specific region. Particularly, the region at which the specific shutter 603a and specific shutter 605a intersect will have a different plasma distribution profile than the rest of area covered by the plasma distribution mechanism 600. The specific region being affected may correspond to a particular portion of a circuit that may benefit from an affected plasma distribution profile. For example, that part of the circuit may include harder features positioned more closely together and thus it may benefit from stronger etching at that region.

Figure 7:
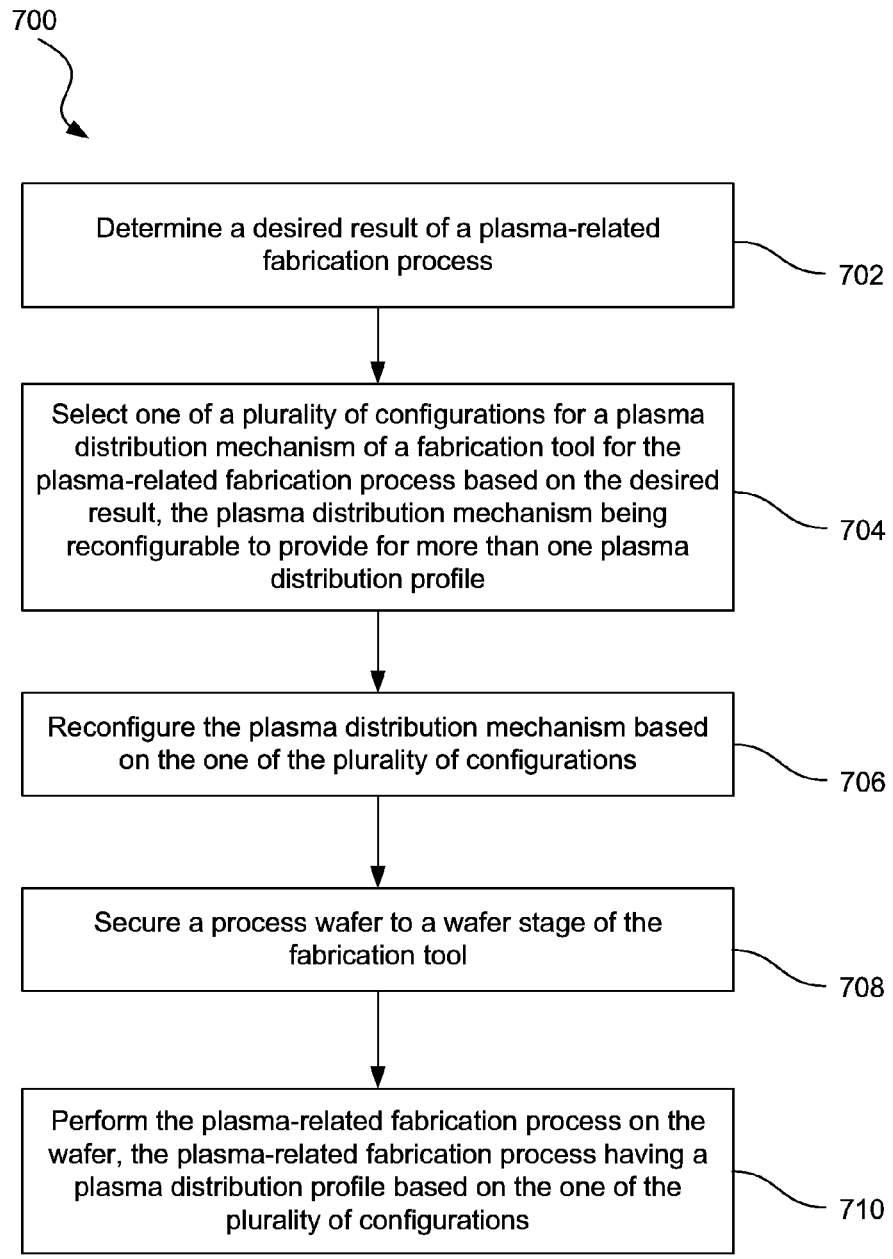
FIG. 7 is a diagram showing an illustrative method for using a plasma distribution mechanism during a fabrication process, according to one example of principles described herein.

FIG. 7 is a diagram showing an illustrative method 700 for using a plasma distribution mechanism during a fabrication process. According to the present example, the method 700 includes a process 702 for determining a desired result of a plasma-related process. For example, it may be determined that it is desirable to have an etching process be reduced in a particular zone if a dishing effect typically occurs in that zone. In a further example, it may desirable to have a deposition process deposit more material at a particular zone if a dishing effect typically occurs in that zone.

The method 700 further includes a process 704 for selecting one of a plurality of configurations for a plasma distribution mechanism of a fabrication tool for the plasma-related fabrication process based on the desired result. For example, various configurations of a plasma distribution mechanism may increase or decrease the efficacy of a deposition process or an etching process at a particular zone. Thus, if it is desire to enhance an etching process at a particular zone, a plasma distribution mechanism configuration can be selected that will produce the desired plasma distribution profile and thus the desired result of the etching process. Such a selection may be based on historical data. For example, it may have been determined through past experience that performing a particular plasma-related fabrication process on a wafer with a particular pattern tends to result in an undesired curve of the surface or other abnormality. Thus, when such a plasma-related fabrication process is to be performed on a wafer with the particular pattern, then the historical data may be consulted to determine an appropriate configuration of the plasma distribution profile that will achieve the desired plasma distribution profile. The desired plasma distribution profile is one that will compensate for undesirable results of the fabrication process.

The method 700 further includes a process 700 for reconfiguring the plasma distribution mechanism based on the selected one of the plurality of configurations. For example, the appropriate combination of dielectric plates or rings may be compiled and inserted into the appropriate slot. In some examples, the various fans as described above may be rotated into particular positions. In some examples, the various shutters as described above may be shifted to their appropriate positions in order to achieve the desired configuration of the plasma distribution mechanism that will result in the desired plasma distribution profile. This may be done manually by a technician. In some examples, this may be done through robotic systems that are controlled by a control system.

The method 700 further includes a process 708 for securing a process wafer to a wafer stage within a fabrication tool. A process wafer is a wafer to which various fabrication processes are applied. The wafer may be secured by robotic means. The wafer may be ready for a particular plasma-related process, such as plasma etching or a plasma deposition process.

The method 700 further includes a process 710 for performing the plasma-related fabrication process on the wafer. The plasma-related fabrication process has a plasma distribution profile based on the selected configurations. As mentioned above, the plasma-related fabrication process may be one of a variety of processes that involve plasma. In one example, the plasma related process is a plasma etching process. In one example, the plasma related process is a plasma deposition process such as a PVD process or a PECVD process.

According to one example, a system is configured to perform plasma related fabrication processes. The system includes a process chamber and a wafer stage positioned within the process chamber. The wafer stage is configured to secure a process wafer. The system further includes a bottom electrode positioned beneath the wafer stage, a top electrode positioned external to the chamber, and a plasma distribution mechanism. The plasma distribution mechanism is reconfigurable to allow for more than one plasma distribution profile.

According to one example, a system includes a fabrication tool having a wafer stage positioned within a fabrication chamber, a plasma distribution mechanism, and a control system. The control system includes a processor and a memory with machine readable instructions that when executed by the processor, cause the system to select one of a plurality of configurations for the plasma distribution mechanism, each of the configurations being designed to produce a different plasma distribution profile.

A method includes securing a process wafer to a wafer stage within a fabrication tool, the fabrication tool comprising a plasma distribution mechanism that is reconfigurable to provide for more than one plasma distribution profile, selecting one of a plurality of configurations for the plasma distribution mechanism, reconfiguring the plasma distribution mechanism based on the one of the plurality of configurations, and performing a plasma-related fabrication process on the wafer, the plasma-related fabrication process having a plasma distribution profile based on the one of the plurality of configurations.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system configured to perform plasma related fabrication processes, the system comprising:
    a chamber;
    a wafer stage positioned within the chamber, the wafer stage being configured to secure a process wafer;
    a bottom electrode positioned beneath the wafer stage;
    a top electrode positioned external to the chamber; and
    a plasma distribution mechanism, the plasma distribution mechanism being reconfigurable to allow for more than one plasma distribution profile.

2. The system of claim 1, wherein the plasma distribution mechanism comprises:
    a slot positioned between the top electrode and the wafer stage; and
    a set of dielectric plates, each dielectric plate configured to be received in the slot, each dielectric plate having varying characteristics such that placement of different dielectric plates in the slot results in different plasma distribution profiles.

3. The system of claim 2, wherein the dielectric plates vary in thickness.

4. The system of claim 2, wherein the dielectric plates vary in material.

5. The system of claim 1, wherein the plasma distribution mechanism comprises a set of rotatable fans, each fan having a different blade length.

6. The system of claim 5, wherein each of the fans varies in at least one of thickness and material.

7. The system of claim 5, wherein the fans are configured to rotate while maintaining a set configuration relative to each other.

8. The system of claim 1, wherein the plasma distribution mechanism comprises a plurality of sets of concentric rings, each set being a different size.

9. The system of claim 8, wherein each set includes rings with various thicknesses or materials.

10. The system of claim 1, wherein the plasma distribution mechanism comprises:
    a first set of elongated shutters; and
    a second set of elongated shutters positioned orthogonal to the first set of elongated shutters.

11. The system of claim 10, wherein the first set of elongated shutters differs from the second set of elongated shutters in at least one of: thickness and material.

12. The system of claim 10, wherein the first set of elongated shutters and the second set of elongated shutters are independently rotatable.

13. The system of claim 10, wherein the system is configured to perform one of: a plasma etching process or a Chemical Vapor Deposition (CVD) process.

14. The system of claim 10, wherein the system is configured to perform a physical vapor deposition process, and the system further includes a target positioned between the plasma distribution mechanism and the wafer stage.

15. A system comprising:
    a fabrication tool comprising:
        a wafer stage positioned within a fabrication chamber; and
        a plasma distribution mechanism; and
    a control system comprising:
        a processor; and
        a memory with machine readable instructions that when executed by the processor, cause the system to select one of a plurality of configurations for the plasma distribution mechanism, each of the configurations being designed to produce a different plasma distribution profile.

16. The system of claim 15, wherein the plasma distribution mechanism is manually reconfigurable by a human operator.

17. The system of claim 15, wherein the plasma distribution mechanism is automatically reconfigurable through a robotic system.

18. A method comprising:
    determine a desired result of a plasma-related fabrication process;
    selecting one of a plurality of configurations for a plasma distribution mechanism of a fabrication tool for the plasma-related fabrication process based on the desired result, the plasma distribution mechanism being reconfigurable to provide for more than one plasma distribution profile;
    reconfiguring the plasma distribution mechanism based on the one of the plurality of configurations;
    securing a process wafer to a wafer stage within the fabrication tool; and performing the plasma-related fabrication process on the process wafer, the plasma-related fabrication process having a plasma distribution profile based on the one of the plurality of configurations.

19. The method of claim 18, wherein the one of the plurality of configurations is selected based on a current profile of the process wafer.

20. The method of claim 18, wherein the one of the plurality of configurations is selected based on historical data associated with the plasma-related fabrication process.

* * * * *